US009928126B1

(12) United States Patent
Shappir et al.

(10) Patent No.: US 9,928,126 B1
(45) Date of Patent: Mar. 27, 2018

(54) RECOVERY FROM CROSS-TEMPERATURE READ FAILURES BY PROGRAMMING NEIGHBOR WORD LINES

(71) Applicant: Apple Inc., Cupertino, CA (US)

(72) Inventors: Assaf Shappir, Ganey Tikva (IL); Moshe Neerman, Kiryat Ono (IL); Ofer Shapira, Tel Aviv (IL)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 15/716,684

(22) Filed: Sep. 27, 2017

Related U.S. Application Data

(60) Provisional application No. 62/513,456, filed on Jun. 1, 2017.

(51) Int. Cl.
*G06F 11/00* (2006.01)
*G11C 7/04* (2006.01)
*G06F 11/30* (2006.01)

(52) U.S. Cl.
CPC .............. *G06F 11/002* (2013.01); *G11C 7/04* (2013.01); *G06F 11/3058* (2013.01)

(58) Field of Classification Search
CPC ....... G06F 11/002; G06F 11/3058; G11C 7/04
USPC .......................................................... 365/211
See application file for complete search history.

(56) References Cited

U.S. PATENT DOCUMENTS

| 5,532,962 | A | 7/1996 | Auclair et al. |
| 5,657,332 | A | 8/1997 | Auclair et al. |
| 5,696,717 | A | 9/1997 | Koh |
| 5,799,200 | A | 8/1998 | Brant et al. |
| 5,867,429 | A | 2/1999 | Chen et al. |
| 5,901,089 | A | 5/1999 | Korsh |
| 6,209,113 | B1 | 3/2001 | Roohparvar et al. |
| 6,288,944 | B1 | 9/2001 | Kawamura |
| 6,363,008 | B1 | 3/2002 | Wong |
| 6,522,580 | B2 | 2/2003 | Chen et al. |
| 6,560,152 | B1 | 5/2003 | Cernea |
| 6,731,557 | B2 | 5/2004 | Beretta |
| 6,934,188 | B2 | 8/2005 | Roohparvar et al. |
| 7,031,210 | B2 | 4/2006 | Park et al. |

(Continued)

OTHER PUBLICATIONS

Bez et al., "Introduction to Flash memory", Proceedings of the IEEE, vol. 91, No. 4, pp. 489-502, Apr. 2002.

(Continued)

*Primary Examiner* — Harry W Byrne
(74) *Attorney, Agent, or Firm* — D. Kligler IP Services LTD.

(57) ABSTRACT

A memory system includes an interface and storage circuitry. The interface is configured to communicate with memory cells that store data. The storage circuitry is configured to program a data unit to a first group of the memory cells, to read the data unit from the first group using at least a read threshold to produce a first readout, and in response to detecting that reading the data unit has failed because the read threshold has fallen outside a supported range of read thresholds, due to a temperature difference between a time of programming the first group and a time of reading the first group, to program a second group of the memory cells. The circuitry is further configured to re-read the data unit from the first group using the at least read threshold to produce a second readout, and to recover the data unit from the second readout.

18 Claims, 5 Drawing Sheets

(56) References Cited

U.S. PATENT DOCUMENTS

| | | | |
|---|---|---|---|
| 7,057,958 B2 | 6/2006 | So et al. | |
| 7,099,194 B2 | 8/2006 | Tu et al. | |
| 7,102,924 B2 | 9/2006 | Chen et al. | |
| 7,277,355 B2 | 10/2007 | Tanzawa | |
| 7,280,409 B2 | 10/2007 | Misumi et al. | |
| 7,342,831 B2 | 3/2008 | Mokhlesi | |
| 7,397,697 B2 | 7/2008 | So et al. | |
| 7,593,259 B2 | 9/2009 | Kim et al. | |
| 7,656,734 B2 | 2/2010 | Thorp et al. | |
| 7,733,712 B1 | 6/2010 | Walston et al. | |
| 7,751,240 B2 | 7/2010 | Shalvi | |
| 7,755,946 B2 | 7/2010 | Dunga et al. | |
| 7,773,413 B2 | 8/2010 | Shalvi et al. | |
| 7,881,107 B2 | 2/2011 | Shalvi | |
| 7,975,192 B2 | 7/2011 | Sommer et al. | |
| 7,978,516 B2 | 7/2011 | Olbrich et al. | |
| 8,000,135 B1 | 8/2011 | Perlmutter et al. | |
| 8,000,141 B1* | 8/2011 | Shalvi | G11C 11/5628 365/185.09 |
| 8,050,086 B2 | 11/2011 | Shalvi et al. | |
| 8,156,403 B2 | 4/2012 | Shalvi et al. | |
| 8,169,825 B1 | 5/2012 | Shalvi et al. | |
| 8,213,255 B2 | 7/2012 | Hemink et al. | |
| 8,234,545 B2 | 7/2012 | Shalvi et al. | |
| 8,239,735 B2 | 8/2012 | Shalvi et al. | |
| 8,514,646 B1 | 8/2013 | Nan et al. | |
| 8,527,819 B2 | 9/2013 | Shalvi et al. | |
| 8,570,804 B2 | 10/2013 | Shalvi et al. | |
| 8,599,611 B2 | 12/2013 | Shalvi et al. | |
| 8,611,157 B2 | 12/2013 | Dutta et al. | |
| 8,773,905 B1 | 7/2014 | Radinski | |
| 9,292,381 B2 | 3/2016 | Shalvi et al. | |
| 9,543,028 B2 | 1/2017 | Ray et al. | |
| 2003/0189856 A1 | 10/2003 | Cho et al. | |
| 2005/0157555 A1 | 7/2005 | Ono et al. | |
| 2006/0028875 A1 | 2/2006 | Avraham et al. | |
| 2006/0221714 A1 | 10/2006 | Li et al. | |
| 2007/0006013 A1 | 1/2007 | Moshahedi et al. | |
| 2007/0115726 A1 | 5/2007 | Cohen et al. | |
| 2007/0159892 A1 | 7/2007 | Kang et al. | |
| 2008/0025121 A1 | 1/2008 | Tanzawa | |
| 2008/0151618 A1 | 6/2008 | Sharon et al. | |
| 2009/0091979 A1* | 4/2009 | Shalvi | G11C 11/56 365/185.09 |
| 2009/0094930 A1 | 4/2009 | Schwoerer | |
| 2009/0225595 A1 | 9/2009 | Kim | |
| 2009/0323412 A1 | 12/2009 | Mokhlesi et al. | |
| 2010/0091535 A1 | 4/2010 | Sommer et al. | |
| 2011/0066902 A1 | 3/2011 | Sharon et al. | |
| 2011/0190595 A1* | 8/2011 | Bennett | A61B 1/00016 600/301 |
| 2015/0092488 A1 | 4/2015 | Wakchaure et al. | |

OTHER PUBLICATIONS

Eitan et al., "Multilevel Flash Cells and their Trade-Offs", Proceedings of the 1996 IEEE International Electron Devices Meeting (IEDM), pp. 169-172, New York, USA 1996.

Eitan et al., "Can NROM, a 2-bit, Trapping Storage NVM Cell, Give a Real Challenge to Floating Gate Cells?", Proceedings of the 1999 International Conference on Solid State Devices and Materials (SSDM), pp. 522-524, Tokyo, Japan 1999.

Maayan et al., "A 512 Mb NROM Flash Data Storage Memory with 8 MB/s Data Rate", Proceedings of the 2002 IEEE International Solid-State circuits Conference (ISSCC 2002), pp. 100-101, San Francisco, USA, Feb. 3-7, 2002.

Kim et al., "Future Memory Technology including Emerging New Memories", Proceedings of the 24th International Conference on Microelectronics (MIEL), vol. 1, pp. 377-384, Nis, Serbia and Montenegro, May 16-19, 2004.

Lee et al., "Effects of Floating Gate Interference on NAND Flash Memory Cell Operation", IEEE Electron Device Letters, vol. 23, No. 5, pp. 264-266, May 2002.

Jung et al., in "A 117 mm.sup.2 3.3V Only 128 Mb Multilevel NAND Flash Memory for Mass Storage Applications," IEEE Journal of Solid State Circuits, (11:31), pp. 1575-1583, Nov. 1996.

Takeuchi et al., "A Multipage Cell Architecture for High-Speed Programming Multilevel NAND Flash Memories", IEEE Journal of Solid State Circuits, vol. 33, No. 8, pp. 1228-1238, Aug. 1998.

Takeuchi et al., "A Double Level VTH Select Gate Array Architecture for Multi-Level NAND Flash Memories", Digest of Technical Papers, 1995 Symposium on VLSI Circuits, pp. 69-70, Jun. 8-10, 1995.

Baum et al., U.S. Appl. No. 15/716,703, filed Sep. 27, 2017.

* cited by examiner

RECOVERY FROM CROSS-TEMPERATURE READ FAILURES BY PROGRAMMING NEIGHBOR WORD LINES

CROSS-REFERENCE TO RELATED APPLICATIONS

This application claims the benefit of U.S. Provisional Patent Application 62/513,456, filed Jun. 1, 2017. This application is related to a U.S. Patent Application entitled "Programming schemes for avoidance or recovery from cross-temperature read failures," Ser. No. 15/716,703, filed on even date. The disclosures of these related applications are incorporated herein by reference.

TECHNICAL FIELD

Embodiments described herein relate generally to data storage, and particularly to methods and systems for handling readout errors caused in a memory due to different programming and reading conditions.

BACKGROUND

In various applications, a memory device is required to operate reliably under various operating conditions such as over a wide range of temperatures. As such, data may be programmed to the memory device at a given temperature, and later read from the memory device at a different temperature, which may result in readout errors.

Methods for mitigating degradation in readout performance due to a temperature difference between programming and reading operations are known in the art. For example, U.S. Patent Application Publication 2016/0086674 describes methods for reducing cross-temperature threshold-voltage distribution widening, by applying a temperature-dependent sensing scheme during read operations. During a read operation, the sensing conditions applied to memory cells within a memory array (e.g., the sensing time and the read voltage applied to the memory cells during the sensing time) may be set and/or adjusted based on a temperature of the memory cells during the read operation, a previous temperature of the memory cells when the memory cells were programmed, and the programmed states of neighboring memory cells.

As another example, U.S. Pat. No. 8,213,255 describes a set of target memory cells to which data is programmed and from which the data is read. When reading the data, temperature compensation is provided. The temperature compensation is based on temperature information and the state of one or more neighbor memory cells. When data is read from the target memory cells, the system senses the current temperature and determines the differences in temperature between the current temperature and the temperature at the time the data was programmed. If the difference in temperature is greater than a threshold, the process of reading the data includes providing temperature compensation based on temperature information and neighbor state information.

SUMMARY

An embodiment that is described herein provides a memory system that includes an interface and storage circuitry. The interface is configured to communicate with a plurality of memory cells that store data by setting the memory cells to analog voltages representative of respective storage values. The storage circuitry is configured to program a data unit to a first group of the memory cells, to read the data unit from the first group using at least a read threshold to produce a first readout, and in response to detecting that reading the data unit has failed because at the time of reading the first group, the read threshold has fallen outside a range of read thresholds supported by the memory cells, due to a temperature difference between a time of programming the first group and a time of reading the first group, to program a second different group of the memory cells. After programming the second group, the circuitry is configured to re-read the data unit from the first group using the at least read threshold to produce a second readout, and to recover the data unit from the second readout.

In some embodiments, the storage circuitry is configured to detect that reading the data unit has failed due to a temperature difference between a time of programming the first group and a time of reading the first group. In other embodiments, the storage values correspond to respective predefined programming levels, and the storage circuitry is configured to program at least some of the memory cells in the second group to a highest or to a lowest programming level among the predefined programming levels. In yet other embodiments, storage circuitry is configured to identify, in the first group, one or more memory cells that are estimated to have been read incorrectly, and to program only memory cells in the second group having same respective indices as the identified memory cells of the first group, to the highest or to the lowest programming level.

In an embodiment, the storage circuitry is configured to predefine an intermediate programming level between the highest and the lowest programming levels, and to program to the highest programming level only the memory cells in the second group that belong to programming levels above the intermediate programming level. In another embodiment, the storage circuitry is configured to evict all data stored in the second group to another group of memory cells, to erase the memory cells in the second group, and then to program the second group. In yet another embodiment, the memory cells are arranged in multiple memory blocks that include multiple word lines, and the first group and the second group belong to respective first and second non-adjacent word lines in a common memory block.

In some embodiments, the storage circuitry is configured to program the second group without first erasing the memory cells in the second group. In other embodiments, the first group includes a Word Line (WL) in a memory block, and in response to detecting that reading the data unit from the first group has failed, the storage circuitry is configured to evict to another memory block all WLs in the memory block that read correctly, to scan the remaining WLs that failed, and to recover data read from each of the remaining WLs by programming one or more of the WLs that were evicted. In yet other embodiments, the storage circuitry is configured to program the second group using a programming scheme that includes less than a number of programming levels used in programming the first group.

There is additionally provided, in accordance with an embodiment that is described herein, a method for data storage, including, in a memory system that includes a plurality of memory cells that store data by setting the memory cells to analog voltages representative of respective storage values, programming a data unit to a first group of the memory cells. The data unit is read from the first group using at least a read threshold to produce a first readout. In response to detecting that reading the data unit has failed because, at the time of reading the first group, the read threshold has fallen outside a range of read thresholds supported by the memory cells, a second different group of the memory cells is programmed. After programming the second group, the data unit is re-read from the first group using the at least read threshold to produce a second readout, and the data unit is recovered from the second readout.

There is additionally provided, in accordance with an embodiment that is described herein, a memory system that includes an interface and storage circuitry. The interface is configured to communicate with a plurality of memory cells that store data by setting the memory cells to analog voltages representative of respective storage values. The storage circuitry is configured to receive data for storage, to measure a temperature at a time of programming the received data, and, to program the received data to the memory cells using a first programming scheme when the measured temperature falls within a predefined normal temperature range, and otherwise to program the received data to the memory cells using a second programming scheme having a lower net storage utilization than the first programming scheme.

In some embodiments, the storage circuitry is configured to apply the second programming scheme by programming dummy bits to at least one or more identified memory cells that, when programmed using the first programming scheme, are estimated to be read erroneously if the temperature at reading time differs from the temperature at programming time. In other embodiments, the storage circuity is configured to identify in the received data one or more bit-locations corresponding to the identified memory cells, and to program the dummy bits only in the identified bit-locations. In yet other embodiments, the memory cells support storing data in multiple data pages having respective bit-significance values, and the storage circuitry is configured to apply the second programming scheme by programming multiple instances of at least part of the received data, destined for storage in a data page of a given bit-significance value, in multiple respective groups of the memory cells.

In an embodiment, the storage circuitry is configured to generate the multiple instances by encoding multiple respective partial subsets of the at least part of the received data using an Error Correction Code (ECC). In another embodiment, the storage circuitry is configured to apply the second programming scheme by identifying in the received data one or more bits at respective bit-locations corresponding to identified memory cells that, when programmed using the first programming scheme, are estimated to be read erroneously if the temperature at reading time is different from the temperature at programming time, to program the received data in a first word line of the memory cells, and to program in a second different word line of the memory cells auxiliary bits derived from the identified bits. In yet another embodiment, the storage circuity is configured to recover the received data from the first word line by reading the received data from the first word line, to further read the auxiliary bits from the second word line, and to correct the received data that was read from the first word line based on the auxiliary bits read from the second word line.

In some embodiments, the storage circuitry is configured to derive the auxiliary bits by extracting a partial subset of the identified bits of the received data. In other embodiments, the storage circuitry is configured to derive the auxiliary bits by calculating one or more parity bits over the identified bits of the received data. In yet other embodiments, the memory cells are configured to store data using a predefined number of nominal programming levels of the analog voltages, and the storage circuitry is configured to program the received data to the memory cells using a subset of the programming levels having a number of programming levels smaller than the predefined number.

There is additionally provided, in accordance with an embodiment that is described herein, a method for data storage, including, in a memory system that includes a plurality of memory cells that store data by setting the memory cells to analog voltages representative of respective storage values, receiving data for storage. A temperature is measured at a time of programming the received data. The received data is programmed to the memory cells using a first programming scheme when the measured temperature falls within a predefined normal temperature range, and otherwise the received data is programmed to the memory cells using a second programming scheme having a lower net storage utilization than the first programming scheme.

In some embodiments, the received data includes at least a data page of a given bit-significance, and programing the received data using the second programming scheme includes splitting bits of the data page into first and second groups and filling each of the first and second groups with all-ones bits up to a length of the data page, and programming the filled first and second groups to different respective first and second groups of the memory cells.

These and other embodiments will be more fully understood from the following detailed description of the embodiments thereof, taken together with the drawings in which:

DETAILED DESCRIPTION OF EMBODIMENTS

Overview

Figure 1:
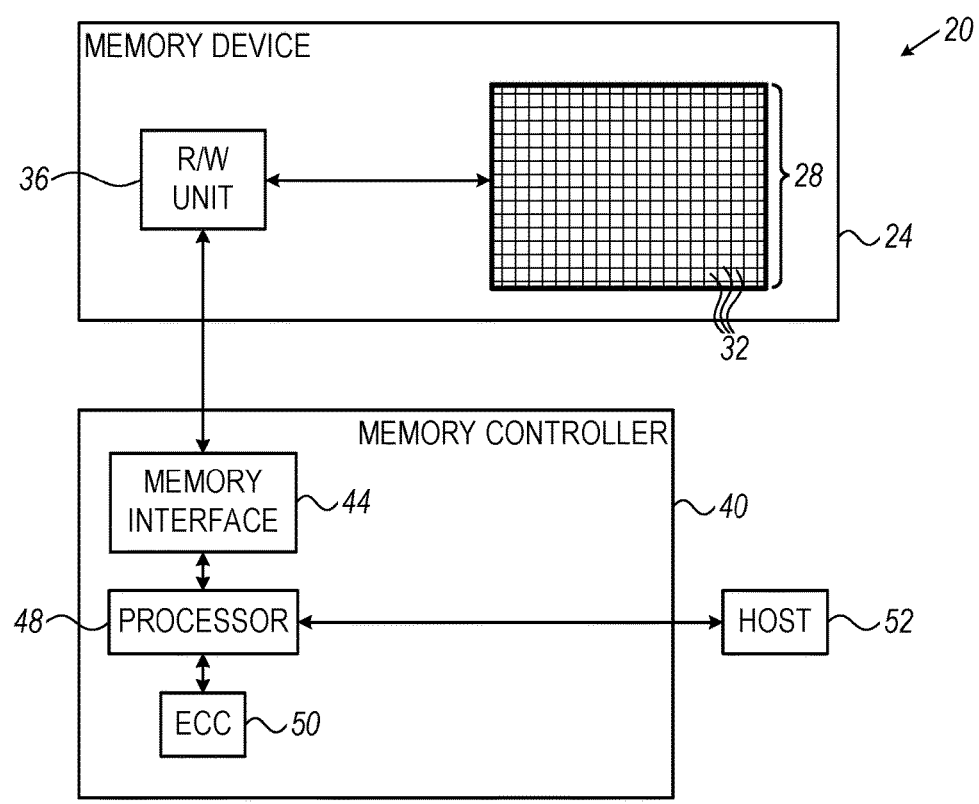
FIG. 1 is a block diagram that schematically illustrates a memory system, in accordance with an embodiment that is described herein.

In various memory devices, data is stored in non-volatile memory cells using multiple predefined programming levels representing respective storage values. The programming levels are associated with respective threshold-voltage distributions, which may be affected by operating conditions such as temperature. For example, various factors such as a temperature change may cause the threshold-voltage distributions to shift to lower or higher threshold voltage values, possibly degrading the readout performance.

In the context of the present disclosure the term "cross-temperature" refers to a temperature difference that may exist between the time of programming data to a given group of memory cells and the time of reading this data from the given group. The degradation in readout performance is typically more severe in case of a high such temperature difference. In addition, the term "cross-temperature conditions" means that the conditions in programming and reading are such that the temperature difference between programming and reading is large enough to cause read errors.

In the context of the present disclosure and in the claims the term "temperature" refers to the temperature of the memory die (or dies), i.e., the temperature of the storage circuitry (see further below) and of the memory cells of the memory device. The temperature may be affected by the rate of the storage operations applied and by ambient temperature.

Embodiments that are described herein provide improved methods and systems for managing data storage in a memory under changing conditions such as cross-temperature conditions. The embodiments that will be described below belong mainly to two different families of solutions. In the first family, coupling between word lines is utilized to shift the threshold-voltage distributions closer to their positions at programming time. In the second family, a dedicated programming scheme is applied if programming is known to occur at an extreme temperature for avoiding readout errors at reading time, or for recovering data that is read erroneously due to the cross-temperature conditions.

In the embodiments that will be described below we consider a memory system in which a memory controller manages data storage in a memory device comprising multiple non-volatile memory cells.

In the disclosed embodiments, reading data from the memory cells typically involves setting one or more read thresholds for sensing the memory cells being read. In some embodiments, in case the threshold-voltage distributions shift over time, e.g., due to a temperature change (or other reasons such as aging), the read thresholds are re-positioned accordingly. Optimal positioning of the read thresholds is carried out by the memory controller, memory device or both, using any suitable method.

In some embodiments, due to hardware design constraints, the read threshold can be set only in a limited range of the threshold voltages. Under cross-temperature conditions, the optimal position of the read thresholds corresponding to the two lowest and two highest programming levels may fall outside the voltage range to which the read thresholds are confined. As a result, a large number of memory cells that were programmed to these programming levels may fall outside the supported voltage range and cannot be read correctly. Cross-temperature conditions may cause the threshold-voltage distributions to shift to higher or lower voltage values. Other factors typically cause the threshold-voltage distributions to shift to higher (e.g., cycling) or lower (e.g., aging) voltage values.

In the description that follows we refer mainly to read failures caused by cross-temperature conditions. The disclosed embodiments are applicable, however, to read failures that occur due to various other reasons that may cause significant shift to the threshold-voltage distributions.

In some embodiments, the memory cells are arranged in Word Lines (WLs), wherein each WL can store multiple data pages, e.g., of different respective bit-significance value. In a general layout of the embodiments of the first family, the memory controller programs a data unit such as a data page, to some Word Line (WL) in a memory block, also referred to herein as a "first WL." To read this data page from the first WL at a later time, the memory device sets at least one read threshold, to produce a first readout for the memory controller. In response to detecting that reading the data page has failed due to a temperature difference between the times of programming and reading, the memory controller programs a second different WL (e.g., neighbor to the first WL) so as to reverse at least part of the effect of the temperature difference on the first WL. After programming the second WL, the memory controller re-reads the data page from the first WL using the at least one read threshold to produce a second readout, and recovers the data page from the second readout. Note that in some practical situations, reading a WL fails only for a data page of one bit-significance value, e.g., the Least Significant Bit (LSB) data page.

The memory controller may compensate for the temperature difference in various ways, as will be described below. In some example embodiments, the memory controller identifies memory cells in the first WL that are likely to read incorrectly due to the temperature difference, and programs only memory cells in the second WL having same respective indices as the identified memory cells of the first WL, to a high or to a low programming level. Programming the second WL to a high (low) programming level shifts the threshold-voltage distributions to higher (lower) voltage values.

In some embodiments, the memory controller programs the second WL without pre-erasure, which may cause over-programming to memory cells in the second WL that are already programmed. In some embodiments, to avoid such over-programming, the memory controller programs to a high programming level only memory cells in the second WL that are already programmed below some predefined programming level. In another embodiment, the memory controller evicts all data stored in the second WL to another WL and re-programs the second WL to a high programming level.

In an embodiment, the memory controller first evicts WLs that were retrieved correctly in a first memory block to a second memory block. The memory controller then sequentially scans the remaining WLs that failed in the first memory block, and for each failing WL programs one or more WLs preceding the failing WL to a high programming level. The memory controller then re-reads the data page whose reading has failed (e.g., the LSB data) from the failing WL, which in now expected to read correctly.

In some embodiments, to reduce the latency caused by programming the second WL to a high programming level, the memory controller programs the second WL in a Single-Level Cell (SLC) mode having only two programming levels.

In a general layout of the embodiments of the second family, the memory controller receives data for storage, and measures the temperature at the time of programming the received data. Upon detecting that the temperature at programming time is moderate, e.g., within a predefined normal temperature range, the memory controller programs the received data using a first programming scheme. Otherwise, the temperature at programming time is considered extreme, and the memory controller programs the received data using a second programming scheme having a lower net storage utilization lower than the first programming scheme.

In describing the embodiments of the second family we generally assume that the failing data page is an LSB data page. This assumption is not mandatory, and the embodiments of the second family are applicable mutatis mutandis to avoiding failures in reading data pages of other bit-significance such as Upper Significant Bit (USB) data pages.

In some embodiments, to avoid unrecoverable failure in reading a LSB data page due to cross-temperature conditions, in applying the second programming scheme, the memory controller programs data only to data pages of higher bit-significance, and programs dummy bits to the LSB data page. In other embodiments, the memory controller identifies in the received data bit-locations corresponding to vulnerable memory cells that would likely to read erroneously if programmed with the received data, and programs dummy bits in the identified bit-locations.

In some embodiments, in applying the second programming scheme, the memory controller programs the LSB data page to two (or more) WLs. To recover the LSB data page, the memory controller reads these two WLs, and takes each LSB bit from the WL in which the respective memory cell is less vulnerable to LSB reading errors. Such programming and reading schemes result in improved readout performance compared to storing the LSB data page in a single WL. In applying this embodiment to devices that store more than two bits per cell, the memory controller programs the LSB data as LSB data pages of two respective WLs, as done, for example, for SLC devices, or alternatively may store the LSB data as a data page of a higher bit-significance (which is considered more reliable than the LSB data page) in at least one of the WLs.

In a variant embodiment, the memory controller programs in one WL the LSB data page bits of which half of the bits are protected using an Error Correction Code (ECC), and programs in another WL the LSB data page bits of which the other half of the bits are protected using the ECC. In the present embodiment, the probability of correct decoding of each of the two readouts from the two WLs is larger than in the previous embodiment.

In some embodiments, to apply the second programming scheme, the memory controller identifies bits corresponding to respective bit-locations of vulnerable memory cells, as described above, programs the received data in a first WL and additionally programs in a second WL auxiliary bits derived from the identified bits. The auxiliary bits may comprise, for example, the identified bits, a partial subset of the identified bits or parity bits derived by encoding the identified bits using a suitable (relatively small) ECC.

The memory cells typically support storing data using a predefined number of nominal programming levels. In some embodiments, the memory controller avoids programming the memory cells to a certain programming level that is vulnerable to read failures due to cross-temperature conditions. In such embodiments, the memory controller programs the received data to the memory cells using a subset of the programming levels having a number of programming levels smaller than the predefined number. For example, in a Triple-Level Cell (TLC) device that uses programming levels L0 . . . L7, the memory controller may store groups of 14 bits in respective groups of 15 memory cells, while occupying only seven programming levels L0 and L2 . . . L7.

By using the disclosed techniques, the memory system operates reliably over a large range of temperatures. Moreover, in the disclosed techniques there is no need for recording the temperature at programming and/or reading times, which may require a large storage space.

System Description

FIG. 1 is a block diagram that schematically illustrates a memory system 20, in accordance with an embodiment that is described herein. Memory system 20 can be used in various host systems and devices, such as in computing devices, cellular phones or other communication terminals, removable memory modules, Solid State Disks (SSD), Secure Digital (SD) cards, Multi-Media Cards (MMC) and embedded MMC (eMMC), digital cameras, music and other media players and/or any other system or device in which data is stored and retrieved.

Memory system 20 comprises a memory device 24, which stores data in a memory array 28 that comprises multiple memory cells 32, such as analog memory cells. In the context of the present patent application, the term "analog memory cell" is used to describe any memory cell that holds a continuous, analog value of a physical parameter, such as an electrical voltage or charge. Memory array 28 may comprise solid-state memory cells 32 of any kind, such as, for example, NAND, NOR and Charge Trap Flash (CTF) Flash cells, phase change RAM (PRAM, also referred to as Phase Change Memory—PCM). Although the embodiments described herein refer mainly to analog memory, the disclosed techniques may also be used with various other memory types. In general, the disclosed embodiments are applicable to any memory technology in which the memory cells cannot be identified as belonging to the programming level to which they were programmed, due to changing operating conditions such as cross-temperature conditions.

The charge levels stored in the memory cells and/or the analog voltages or currents written into and read out of the memory cells are referred to herein collectively as analog values, storage values or analog storage values. Although the embodiments described herein mainly address threshold voltages, the methods and systems described herein may be used with any other suitable kind of storage values.

Note that in the description that follows, the terms "analog values" and "threshold voltages" are used interchangeably.

Memory system 20 stores data in analog memory cells 32 by programming the memory cells to assume respective memory states, which are also referred to as programming levels. The programming levels are selected from a finite set of possible levels, and each programming level corresponds to a certain nominal storage value. For example, a 2 bit/cell Multi-Level Cell (MLC) can be programmed to assume one of four possible programming levels by writing one of four possible nominal storage values into the cell. Similarly, a 3 bit/cell MLC, also referred to as a Triple-Level Cell (TLC), can be programmed to assume one of eight possible programming levels. A memory cell that stores a single bit (i.e., using two programming levels) is also referred to as a Single-Level Cell (SLC).

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of memory array 28, R/W unit 36 converts the storage values of memory cells 32 into digital samples having an integer resolution of one or more bits. Data is typically written to and read from the memory cells in data units that are referred to as data pages (or simply pages, for brevity).

For reading a data page, the R/W unit typically sets one or more read thresholds, e.g., at about mid-points between adjacent nominal programming levels, and senses the threshold voltages of the memory cells relative to the read thresholds.

The storage and retrieval of data in and out of memory device 24 is performed by a memory controller 40. Memory controller 40 comprises a memory interface 44 for communicating with memory device 24, a processor 48, and an Error Correcting Code (ECC) unit 50. The memory controller communicates with the memory device via memory interface 44 over a communication link 46. Communication link 46 may comprise any suitable link or communication bus, such as, for example, a PCIe bus. The disclosed techniques can be carried out by memory controller 40, by R/W unit 36, or both. Thus, in the present context, memory controller 40 and R/W unit 36 are referred to collectively as "storage circuitry" that carries out the disclosed techniques.

Memory controller 40 communicates with a host 52, for accepting data for storage in the memory device and for outputting data retrieved from the memory device. In some embodiments, ECC unit 50 encodes the data for storage using a suitable ECC and decodes the ECC of data retrieved from the memory. ECC unit 50 may comprise any suitable type of ECC, such as, for example, Low Density Parity Check (LDPC), Reed-Solomon (RS) or Bose-Chaudhuri-Hocquenghem (BCH), can be used.

Data read from a group of memory cells 32 may contain one or more errors. The number of errors typically increases when the read threshold used for sensing the memory cells is positioned non-optimally.

Memory controller 40 may be implemented in hardware, e.g., using one or more Application-Specific Integrated Circuits (ASICs) or Field-Programmable Gate Arrays (FPGAs). Alternatively, the memory controller may comprise a microprocessor that runs suitable software, or a combination of hardware and software elements.

The configuration of FIG. 1 is an example memory system configuration, which is shown purely for the sake of conceptual clarity. Any other suitable memory system configuration can also be used. For example, although the example of FIG. 1 shows a single memory device, in alternative embodiments memory controller 40 may control multiple memory devices 24, e.g., in a RAID storage system. Elements that are not necessary for understanding the principles of the present disclosure, such as various interfaces, addressing circuits, timing and sequencing circuits and debugging circuits, have been omitted from the figure for clarity.

In the example memory system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor or other element of the host system. In some embodiments, host 52 and memory controller 40 may be fabricated on the same die, or on separate dies in the same device package.

In some embodiments, processor 48 of memory controller 40 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of memory array 28, memory cells 32 are arranged in multiple rows and columns, and each memory cell comprises a floating-gate transistor or a charge trap transistor. In other embodiments, the memory cells in memory array 28 are arranged in a three-dimensional (3D) configuration, in which the memory cells belong to rows, columns and strings. In memory array 28, the gates of the transistors in each row are connected by word lines, and the sources of the transistors in each column are connected by bit lines. In the present context, the term "row" is used in the conventional sense to mean a group of memory cells that are fed by a common word line, and the term "column" means a group of memory cells fed by a common bit line. The terms "row" and "column" do not connote a certain physical orientation of the memory cells relative to the memory device. The memory array is typically divided into multiple memory pages, i.e., groups of memory cells that are programmed and read simultaneously. In 3D devices, each string connects to a respective bit line, and each memory cell in the string connects to a respective word line.

In some embodiments, memory pages are sub-divided into sectors. Data pages may be mapped to word lines in various manners. Each word line may store one or more data pages. A given data page may be stored in all the memory cells of a word line, or in a subset of the memory cells (e.g., the odd-order or even-order memory cells). To access a specific word line or data page, the memory device is provided with a respective physical address.

Erasing of the memory cells in memory array 28 is usually carried out in blocks that contain multiple memory pages. Typical memory devices may comprise thousands of erasure blocks (also referred to as "memory blocks"). In a typical two-dimensional (2D) two-bit-per-cell MLC device, each erasure block is on the order of 128 word lines, each comprising several tens of thousands of memory cells. Two-bit-per-cell devices having 128 word lines per erasure block that store a data page per bit-significance value would have 256 data pages per erasure block, and three-bit-per-cell devices would have 384 data pages per block. A typical three-dimensional (3D) device that stores three bits per cell may comprise, for example, 4 sections per block, wherein each section comprises several thousand strings that each comprises 48 layers of cell columns. Such a 3D device has 12 data pages per a physical word line, or 576 data pages per an erasure block. Alternatively, other block sizes and configurations can also be used.

Memory cells 32 are typically implemented using a transistor comprising a gate terminal, a source terminal and a drain terminal. The memory cell assumes a certain threshold voltage, denoted $V_T$, according to the programming level to which the memory cell is programmed. When applying a read voltage (denoted RV) between the gate and source terminals, the transistor conducts a certain drain current level when $V_T<RV$ and no or only little current when $V_T>RV$.

In a region of voltages just below $V_T$, the logarithm of the drain current typically depends linearly on the gate voltage $V_{GS}$. The inverse slope of this linear dependence is referred to as a "sub-threshold slope." In a transistor having a poor sub-threshold slope the drain current grows slowly with $V_{GS}$. The drain current also depends on temperature such that lower temperatures result in lower drain currents. As a result, the read threshold RV needs to be increased to compensate for the reduction in the drain current.

In some 3D devices, the memory cells use polysilicon as a conducting material, for which the conductance typically decreases with temperature due to grain boundaries. This is typically the main reason for the reduction of the drain current with temperature, which needs to be compensated for by increasing the gate voltage. The amount of reduction of the drain current may increase due to array variation, and/or as the sub-threshold slope degrades with cycling during the lifetime of the device. These factors further degrade the readout performance caused by the cross-temperature conditions under the limited voltage range for setting the read thresholds.

In various applications, memory system 20 is required to operate over a wide range of temperatures, e.g., between −15° C. and 85° C. In some embodiments, memory system 20 comprises a temperature sensor (not shown) that reports temperature measurements of the die to processor 48.

The Effect of Cross-Temperature on Threshold-Voltage Distributions

Figure 2:
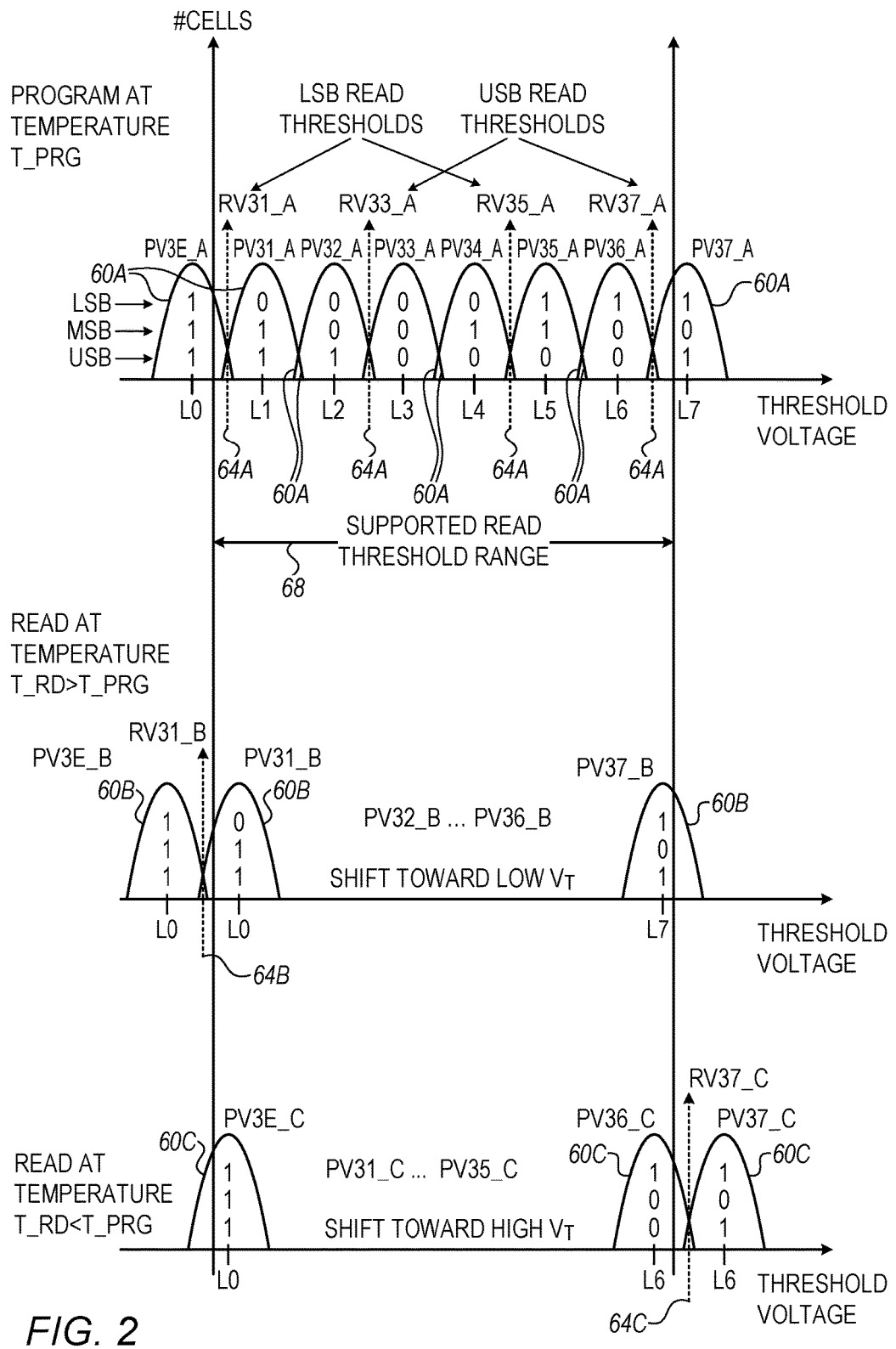
FIG. 2 is a diagram that schematically illustrates threshold-voltage distributions in a Triple-Level Cell (TLC) memory device, corresponding to different programming and reading temperatures, in accordance with an embodiment that is described herein.

FIG. 2 is a diagram that schematically illustrates threshold-voltage distributions in a TLC memory device, corresponding to different programming and reading temperatures, in accordance with an embodiment that is described herein. In TLC, the memory controller programs data in eight programming levels that are referred to herein as L0 . . . L7.

The upper part of FIG. 2 depicts threshold-voltage distributions 60A corresponding to respective programming levels L0 . . . L7, at programming time. The temperature present at programming time is denoted T_PRG. L0 is an erasure level whose threshold-voltage distribution is denoted PV3E. The threshold-voltage distributions corresponding to L1 . . . L7 are denoted PV31 . . . PV37, respectively. As depicted in the upper part of FIG. 2, at temperature T_PRG, the threshold-voltage distributions are denoted PV3E_A for L0 and PV31_A_PV37_A for L1 . . . L7, respectively.

In some embodiments, the memory controller stores data to the memory cells in units of a data page. In the present example, the memory controller stores three data pages to a group of memory cells that typically belong to a common word line. The three data pages are denoted Least Significant Bit (LSB), Most Significant Bit (MSB) and Upper Significant Bit (USB) data pages, for the respective lower, middle and upper bit-significance data pages.

The memory controller may encode bits for storage into programming levels in various ways. In some embodiments, the memory controller encodes 3-bit groups into the eight programming levels using a Gray code as given in Table 1.

TABLE 1

Gray code used for mapping between bit-triples and programming levels

| PAGE/LEVEL | L0 | L1 | L2 | L3 | L4 | L5 | L6 | L7 |
|---|---|---|---|---|---|---|---|---|
| LSB | 1 | 0 | 0 | 0 | 0 | 1 | 1 | 1 |
| MSB | 1 | 1 | 0 | 0 | 1 | 1 | 0 | 0 |
| USB | 1 | 1 | 1 | 0 | 0 | 0 | 0 | 1 |

To read a data page stored in the non-volatile memory, the memory controller (or R/W unit) typically sets one or more read thresholds 64A, and using the R/W unit senses whether the threshold voltages of the memory cells being read are below or above the read thresholds. For example, in the upper part of FIG. 2, to read the LSB page, the memory controller sets read thresholds denoted RV31_A and RV35_A. The memory controller sets RV31_A at about a mid-point between threshold-voltage distributions PV3E_A and PV31_A. Similarly, the memory controller sets RV35_A to a mid-point between threshold-voltage distributions PV34_A and PV35_A. In a similar manner, to read the USB page, the memory controller sets read thresholds PV33_A and PV37_A.

In some embodiments, the memory controller determines an optimal setting for the read thresholds using any suitable acquisition process. For example, the memory controller may perform multiple read operations at multiple respective positions of the read thresholds at the vicinity of RV31_A (and/or other read thresholds) to produce multiple respective readouts, and position RV31_A based on the number of errors in the respective readouts.

In some embodiments, the memory device supports setting read thresholds only within a predefined voltage range 68. In FIG. 2, at temperature T_PRG, all the read thresholds, including RV31_A and RV37_A, fall within voltage range 68. Moreover, the lower tail of PV31_A and the upper tail of PV36_A also fall within voltage range 68, which maintains the number of readout errors in reading an LSB page or a USB page within the error correction capabilities of ECC unit 50.

As noted above, the middle part of FIG. 2 refers to reading at a temperature T_RD that is much higher than T_PRG (e.g., T_PRG=0° C. and T_RD=85° C.). As a result, at the time of reading, the threshold-voltage distributions are shifted towards lower voltage values of the threshold voltage axis. In the present example, PV31E_A and PV31_A shift to lower respective threshold voltages as depicted by PV31E_B and PV31_B (60B), and therefore the optimal read threshold RV31_B (64B) now falls outside voltage range 68. As a result, the threshold voltages of some of the memory cells that were programmed to L1 at temperature T_PRG now fall between RV31_B and the lower boundary of voltage range 68. In such cases, the number of errors in reading the LSB data page exceeds the error correction capabilities of the ECC with high probability, in which case the LSB data page is unrecoverable from the LSB readout result.

A similar scenario occurs in the lower part of FIG. 2, in which T_RD<T_PRG (e.g., T_PRG=85° C. and T_RD=0° C.). In this case, the threshold-voltage distributions shift to higher threshold voltages, which may cause the optimal read threshold RV37_C (64C) to fall outside voltage range 68. In this case the USB page may be unrecoverable from the USB readout result.

Note that an ECC decoding failure typically relates to shifting of one of the optimal read thresholds RV31_A or RV37_A outside voltage range 68. Therefore, unrecoverable ECC decoding due to cross-temperature may occur in reading a LSB data page or a USB page, but typically not in both simultaneously.

Word lines having high indices in a block are more likely to suffer from cross-temperature effects than word lines having low indices. At least one reason for this is the back-pattern effect, i.e., the threshold voltage of a memory cell depends on the states of the memory cells along the same bit line between the memory cells being read and the sensing circuit of the bit line. As a result, the threshold voltages of the memory cells in WLs that are programmed first will typically tend to shift to higher voltage values due to the programming of subsequent WLs, whereas WLs having high respective indices will typically have most of their WL neighbors already programmed and therefore will typically experience a low post-programming shift. In addition, in 3D devices, WLs having high respective indices typically reside at the top of the WL stack and are characterized by a wider metal hole (hole radius), and thus will have a weaker gate control over the channel, which translates to a poorer sub-threshold slope and worse cross-temperature behavior.

To summarize, in addition to the cross-temperature effect, other factors may increase the likelihood of RV_31 or RV37 falling outside voltage range 68, such as, for example:

In some non-volatile memory technologies, the memory cells are implemented using transistors having a poor sub-threshold slope. For example, in some Three-Dimensional (3D) memory cells, poor sub-threshold slope is related to implementing the memory cells using large-radius metal holes at the top of the WL stack, gate dielectric material of poor-quality, degradation of gate dielectric material during lifetime (program erase cycles) and using a channel made of poly-silicon material, which has poor electrical current conductivity.

Program and Erase (P/E) cycling, e.g., the sub-threshold slope degrades with the number of P/E cycles applied.

Resolving Read Failures Related to Hitting the Boundary of the Supported Read Threshold Range by Programming Other Word Lines As noted above, programming the memory cells in one WL may cause the threshold voltages of memory cells in a neighboring WL to change, e.g., due to coupling, back-pattern and program disturb. For example, when a memory cell in word line WL(n) of a memory block ('n' denoted the index of the WL in the memory block) is programmed to a high programming level (e.g., L7), the threshold voltage of a neighbor cell in an adjacent word line WL(n+1) or WL(n−1) will typically be pushed to a higher value.

Table 2 below depicts the programming levels and respective threshold voltages of four memory cells in WL(n) at a temperature of −15° C. Assume the memory cells in WL(n+1) are erased when programming WL(n). The table additionally depicts the threshold voltages after programming four memory cells of the same bit-line indices in a neighbor word line WL(n+1). As seen in Table 2, the programming of CELL #3 and CELL #4 of WL(n+1) to L7 (PV37), causes the threshold voltages of CELL #3 and CELL #4 at WL(n) to change from +0.3V to +0.7V, and from −0.6V to −0.1V, respectively. Since CELL #1 and CELL #2 of WL(n+1) remain erased, CELL #1 and CELL #2 of WL(n) are not affected by the programming of WL(n+1).

TABLE 2

PV shift due to coupling between neighbor word lines

|  | WL (n) before programming WL (n + 1) | WL (n + 1) | WL (n) after programming WL (n + 1) |
|---|---|---|---|
| CELL #1 | +0.3 V (PV31) | L0-PV3E | +0.3 V (PV31) |
| CELL #2 | +1.0 V (PV32) | L0-PV3E | +1.0 V (PV32) |
| CELL #3 | +0.3 V (PV31) | L7-PV37 | +0.7 V (PV31) |
| CELL #4 | −0.6 V (PV3E) | L7-PV37 | −0.1 V (PV3E) |

Assume now that programming both WL(n) and WL(n+1) as depicted in Table 2 occurred at a temperature T_PRG-15° C., and that reading the memory cells of WL(n) occurs at a later time at a temperature T_RD=85° C. The temperature change causes the threshold-voltage distributions to shift by −0.5V, as depicted in Table 3.

TABLE 3

Cross-temperature effect on the memory cells of WL (n)

|  | WL (n) after programming WL (n + 1) (T_PROG = −15° C.) | WL (n) after programming WL (n + 1) (T_RD = 85° C.) |
|---|---|---|
| CELL #1 | +0.3 V (PV31) | −0.2 V (PV3E) |
| CELL #2 | +1.0 V (PV32) | +0.5 V (PV32) |
| CELL #3 | +0.7 V (PV31) | +0.2 V (PV31) |
| CELL #4 | −0.1 V (PV3E) | −0.6 V (PV3E) |

As seen in Table 3, the threshold voltage of CELL #1 in WL(n) has changed, due to the temperature change from 0.3V to −0.2V, meaning that CELL #1 will be wrongly sensed as erased even though CELL #1 was programmed to L1. If a large number of memory cells in WL(n) suffer from the cross-temperature effect similarly to CELL #1, the LSB page readout may contain a number of bit-flips larger than correctable by the ECC decoder, and reading the LSB page will fail.

In some disclosed embodiments, the memory controller recovers the LSB data page read from WL(n) by programming memory cells in a neighbor word line, e.g., WL(n+1) to a high programming level, e.g., to programming level L7. In such embodiments, the memory cells programmed to L7 in the neighboring WLs cause the threshold voltages of the memory cells in WL(n) to shift to higher voltage values. In the present example, the threshold voltages of the memory cells in WL(n) shift up by 0.3V, as depicted in Table 4.

TABLE 4

Recover a LSB data page read from WL (n) by programming memory cells in WL (n + 1) to L7

|  | WL (n) before programming WL (n + 1) to L7 (T_RD = 85° C.) | WL (n) after programming WL (n + 1) to L7 (T_RD = 85° C.) |
|---|---|---|
| CELL #1 | −0.2 V (PV3E) | +0.1 V (PV31) |
| CELL #2 | +0.5 V (PV32) | +0.8 V (PV32) |
| CELL #3 | +0.2 V (PV31) | +0.5 V (PV31) |
| CELL #4 | −0.6 V (PV3E) | −0.3 V (PV3E) |

In some embodiments, the memory controller programs the memory cells in multiple WLs neighboring to WL(n) to L7. For example, to recover a LSB data page read from WL(n), the memory controller programs WL(n−1), WL(n+1) and WL(n+2) to programming level L7, which causes the threshold voltages of the memory cells in WL(n) to shift up by 0.5V, as depicted in Table 5. Note that the higher voltage shift (0.5V compared to 0.3V in Table 4) is caused by (i) the back-pattern effect (higher resistance across the bit line string) and (ii) a program disturb effect.

TABLE 5

Recovering a LSB data page read from WL (n) by programming memory cells in multiple neighbor WLs to L7

|  | WL (n) before programming WL (n − 1), WL (n + 1) and WL (n + 2) to L7 (T_RD = 85° C.) | WL (n) after programming WL (n − 1), WL (n + 1) and WL (n + 2) to L7 (T_RD = 85° C.) |
|---|---|---|
| CELL #1 | −0.2 V (PV3E) | +0.3 V (PV31) |
| CELL #2 | +0.5 V (PV32) | +1.0 V (PV32) |
| CELL #3 | +0.2 V (PV31) | +0.7 V (PV31) |
| CELL #4 | −0.6 V (PV3E) | −0.1 V (PV3E) |

In the embodiments described above, the memory controller programs the memory cells in one or more neighboring WLs to L7 in an attempt to increase the threshold voltages of the memory cells in WL(n) that are programmed to L0 and to L1, for compensating for the cross-temperature effect. This approach, however, may undesirably also increase the threshold voltages of the memory cells in WL(n) that are programmed to respective programming levels L2 . . . L7.

In some embodiments, to prevent such undesirable threshold voltage increase, the memory controller first reads the MSB and USB data pages from WL(n), and identifies the memory cells of WL(n) that are programmed to L1 by identifying the memory cells in WL(n) in which MSB=1 and USB=1. The memory controller programs only memory cells in a neighboring WL having the same bit-line indices as the identified memory cells to a high programming level (e.g., to L7). In the example of Table 3 above, in using this scheme, only CELL #1 and CELL #3 of WL(n+1) will be programmed to L7.

In some embodiments, when the memory controller attempts reading a LSB data page from WL(n), the WLs neighboring to WL(n) are already programmed with useful data and therefore cannot be re-programed (e.g., to a high programming level) as required for recovering the LSB data page of WL(n). Assume, for example, that for recovering an LSB data page read from WL(n), the memory controller is required to program WL(n+1) to a high programming level. In an embodiment, the memory controller first reads and decodes the ECC of the data programmed in WL(n+1), i.e., all LSB, MSB and USB data pages stored in WL(n+1). The memory controller stores the data retrieved from WL(n+1) in another WL on a different memory block, and then programs WL(n+1) as required to recover the LSB data page from WL(n). In some embodiments, the memory controller evicts the entire memory block, and then erases the memory block before reusing it, or alternatively marks the evicted memory block as unusable.

In some practical cases, two (or more) adjacent WLs fail to read due to the cross-temperature effect. Assume, for example, that reading from each of WL(n−1) and WL(n) fails, but WL(n−2) reads correctly. In some embodiments, to overcome such mode of a failure, the memory controller first evicts the data stored in WL(n−2) to another available WL (in another memory block) and after the eviction of WL(n−2) programs WL(n−2) to L7. Then the memory controller retrieves the data programmed in WL(n−1), which is now expected to read correctly, and programs WL(n−1) to L7, to recover the LSB data page from WL(n). After programming WL(n−1) to L7 the memory controller reads the data stored in WL(n). The reading scheme described above is applicable similarly to cases in which three or more consecutive WLs fail to read.

As a general remark, note that in some embodiments, the memory controller programs a neighbor WL to a programming level lower than to L7, e.g., to L6 or L5. In such embodiments, programming the neighbor WL to, e.g., L6, causes a sufficient shift to the threshold-voltage distributions for recovering the data page whose reading has failed, but causes a reduced cross-talk effect compared to programming to L7.

In the programming schemes described above, the memory controller programs the memory cells in a given word line without first erasing them, even when these memory cells are already programmed with some data. Programming without pre-erasure may cause undesirable effects such as over-programming and reliability degradation. Note that in the schemes described above the memory controller typically programs the word lines of a memory block in a non-sequential order (the conventional order is sequentially from the bottom WL to the top WL of the memory block), a drain-side boosting mechanism of the memory device designed to prevent disturb in adjacent WLs may fail in preventing the over-programming effect.

Figure 3:
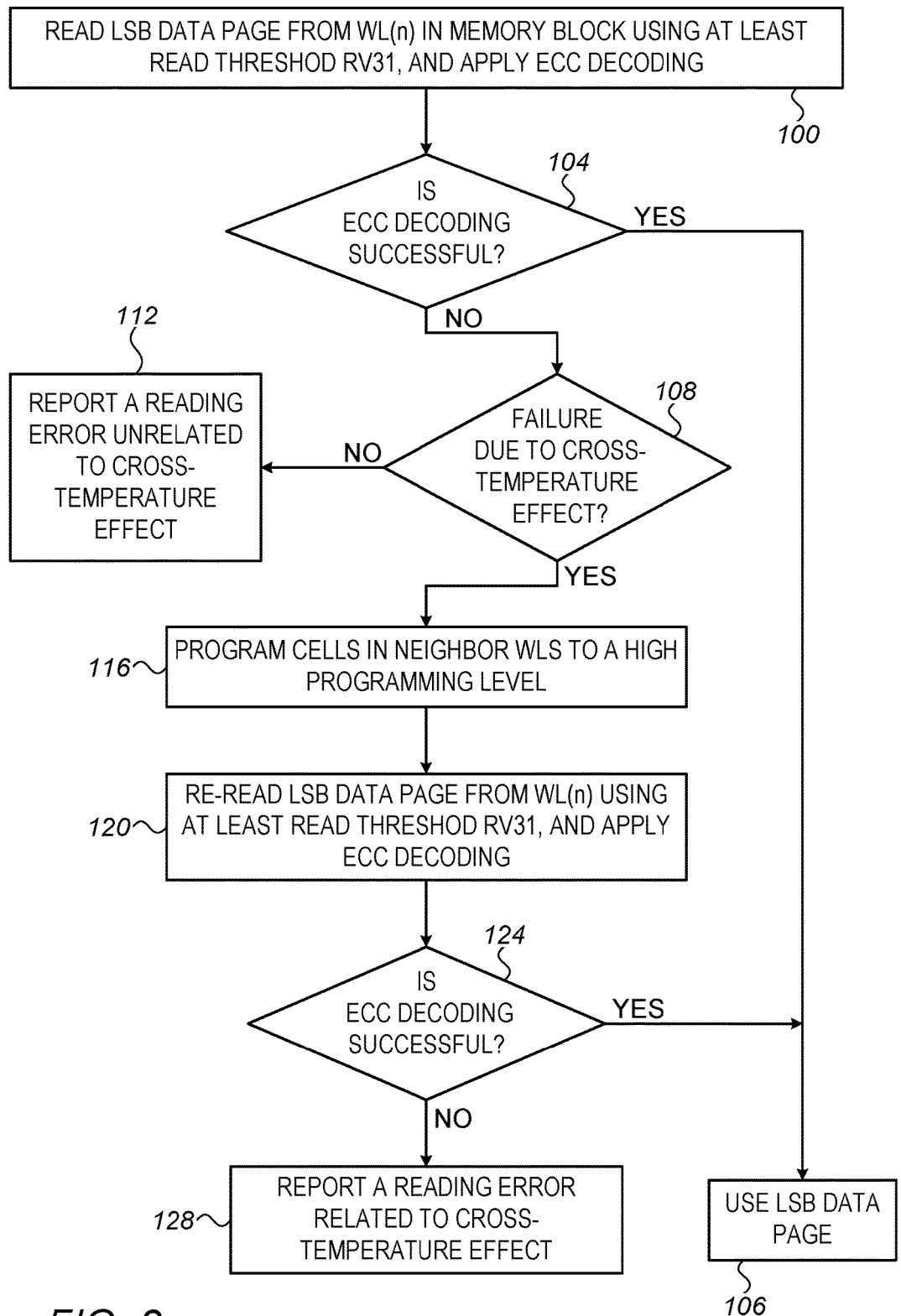
FIG. 3 is a flow chart that schematically illustrates a method for recovering a data page that failed to read due to a temperature difference between programming and reading, in accordance with an embodiment that is described herein.

The memory controller may reduce undesirable effects due to programming without pre-erasure in various ways. For example, in some embodiments, the memory controller reads the data stored in a WL to be programmed, identifies memory cells in the WL that are programmed to a programming level higher than a predefined programming level (e.g., above L6), and masks out the identified memory cells by disabling the programming of the identified memory cells. The predefined programming level is selected between the lowest and highest programming levels, i.e., one of programming levels L1 . . . L6. FIG. 3 is a flow chart that schematically illustrates a method for recovering a data page that failed to read due to temperature difference between programming and reading, in accordance with an embodiment that is described herein. The method will be described as being executed by processor 48 and R/W unit 36.

The method begins with processor 48 reading an LSB data page from the $n^{th}$ word line WL(n) of a memory block at a LSB data page reading step 100. The LSB data page is assumed to be stored encoded, e.g., using ECC 50. In the present example, to read the LSB data page, processor 48 instructs R/W unit 36 to set read thresholds RV31 and RV35 (between the threshold voltage distributions corresponding to programming levels L0 and L1, and programming levels L4 and L5, respectively. The R/W unit senses the memory cells of WL(n), using RV31 and RV35, to produce a readout result for the processor, which applies to the readout result ECC decoding using ECC unit 50. At a read verification step 104, the processor checks whether the ECC has been decoded successfully, and if so, proceeds to a LSB page usage step 106, for using the LSB data page, e.g., by sending the successfully decoded LSB data page to host 52.

If the ECC decoding at step 104 has failed, the processor proceeds to a cross-temperature checking step 108. At step 108, the processor checks whether the read failure at step 104 occurred because the LSB data page was read at a temperature different from the temperature at which the LSB data page was programmed. In some embodiments, at step 108 the processor reads the LSB data page multiple times by instructing the R/W unit to apply multiple different settings of the read threshold RV31, to produce multiple respective readout results. The processor identifies that the optimal position of RV31 falls below the low boundary of supported voltage range 68 when one or more of the readouts corresponding to the lowest values of setting RV31 contains a large number of errors, e.g., beyond the error correction capabilities of the underlying ECC used.

Alternatively or additionally, the processor is coupled to a temperature sensor (not shown) that provides temperature measurements to the processor. In one such embodiment, the processor records the temperature at programming time, and at step 108 detects a cross-temperature event when the temperature at reading time is different from the temperature recorded at programming time by more than a predefined temperature difference.

When at step 108 the processor detects that the temperature difference between reading and programming is below the predefined temperature difference, the processor reports a read failure that is unrelated to a cross-temperature effect, at a first failure reporting step 112. Otherwise, the processor proceeds to a programming for recovery step 116, to program the memory cells in one or more neighboring WLs to a high programming level, as described above.

At a re-reading step 120, the processor re-reads the LSB data page from WL(n) by instructing the R/W unit to set the read thresholds RV31 and RV35 for sensing the memory cells to produce a second readout. The processor applies to the second readout ECC decoding using ECC unit 50. Because of the coupling between the WLs programmed to the high programming level and the failing WL(n), the second readout is expected to contain no errors, or to contain a number of errors that can be corrected by ECC unit 50.

At a recovery verification step 124, the processor checks whether the ECC decoding of the second readout has succeeded, and if so, the processor proceeds to step 106, to use the recovered LSB data page, as described above. Otherwise, the ECC decoding of the second readout at step 120 has failed, and the processor reports a read failure that is related to cross-temperature, at a second failure reporting step 128. Following step 128 or 106 the method terminates.

In some embodiments, the memory block in which reading a WL has failed is additionally protected using a Redundant Array of Independent Disks (RAID) scheme applied over multiple memory blocks. In such embodiments, the memory controller may attempt recovering the failing memory block using the RAID scheme. In such embodiments, the memory controller may execute step 128 only if recovering the memory block using RAID fails.

Figure 4:
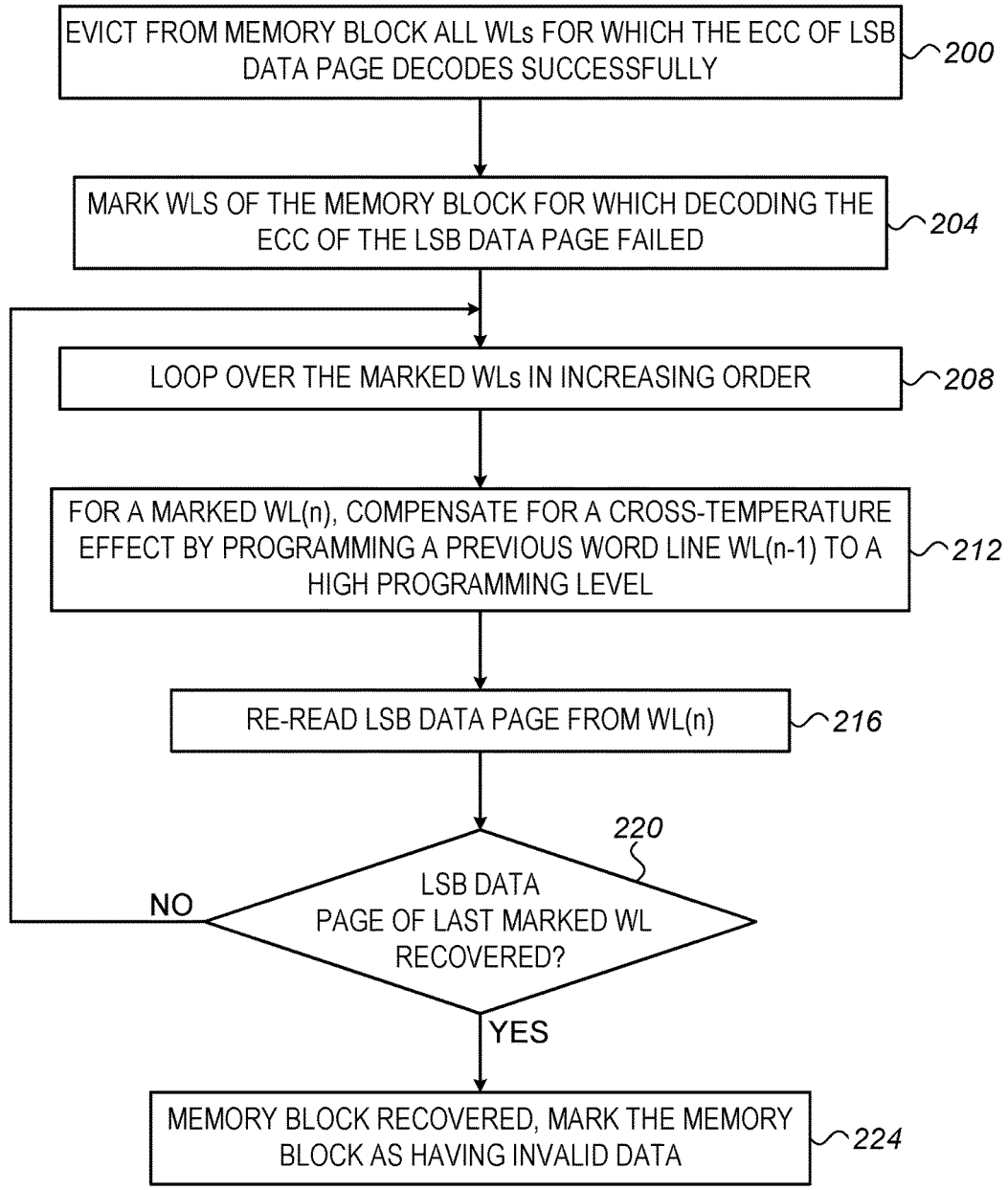
FIG. 4 is a flow chart that schematically illustrates a method for recovering a memory block in which reading at least one data page has failed due to a temperature difference between programming and reading, in accordance with an embodiment that is described herein.

FIG. 4 is a flow chart that schematically illustrates a method for recovering a memory block in which reading at least one data page has failed due to a temperature difference between programming and reading, in accordance with an embodiment that is described herein. The method will be described as being executed by processor 48 and R/W unit 36.

The memory controller may execute the method of FIG. 4, for example, in response to detecting in a memory block a read failure that is related to a temperature difference between programming and reading.

The method begins with processor 48 scanning the WLs of a memory block, at a scanning step 200. The processor reads the LSB data page from each scanned WL to produce a LSB readout and decodes the ECC of this LSB readout using ECC unit 50. To read a LSB data page, the processor instructs the R/W unit to set the read thresholds RV31 and RV35 for sensing the memory cells of the WL in question. Further at step 200, for each WL for which decoding the ECC of the LSB readout has succeeded, the processor evicts the WL content to another memory block.

In some embodiments, to evict a WL at step 200, the processor reads all the data stored in the WL (i.e., the LSB, MSB and USB data pages in a TLC device, by instructing the R/W unit to set relevant read thresholds). The processor decodes the ECC of the data pages read using ECC unit 50 to verify correct reading. The processor (and/or R/W unit) then copies the verified data to another memory block.

At a marking step 204, the processor marks the WLs of the memory block for which decoding the ECC of the LSB data page has failed. In some embodiments, the processor executes steps 200 and 204 in a single scanning iteration.

At a looping step 208, the processor loops over the WLs that were marked at step 204, in an increasing order of the WLs indices. At a neighbor WL programming step 212, for each marked word line, e.g., WL(n), the processor programs the memory cells of the previous word line WL(n−1) to a high programming level, e.g., to L7. In some embodiments, at step 212 the processor programs to the high programming level multiple WLs preceding WL(n). For example, the processor programs to L7 all of or at least some of the word lines WL(0) to WL(n−1), which may increase the threshold voltages of the memory cells in WL(n) to higher values than the values achievable by programming only WL(n−1) to L7.

At a re-reading step 216, the processor re-reads the LSB data page from WL(n). Because the neighbor word line WL(n−1) was programmed to a high programming level, the ECC decoding of the LSB data page re-read from WL(n) is expected to succeed with high probability.

At a loop termination step 220, the processor checks whether all the WLs that were marked at step 204 were processed. When at step 220 the processor detects that there are marked WLs that were not yet processed, the processor loops back to step 208, to proceed the looping. Otherwise, the memory block is fully recovered, and the processor marks the memory block as containing invalid data, at a block-invalidation step 224. Following step 224 the method terminates.

In the method if FIG. 4, the memory controller scans the failing WLs in a sequential order. In alternative embodiments, after evicting the WLs at step 200, the processor programs the memory cells of all the evicted WLs to a high programming level and then attempts to re-read the failing WLs.

In the embodiments described above, the memory controller recovers a given WL by programming another WL to a high programming level. Since programming to a high programming level may take a significant amount of time, this scheme for data page recovery incurs relatively long latencies. In some embodiments, to reduce the programming time, e.g., at step 116 in the method of FIG. 3, the processor identifies the memory cells in WL(n), i.e., in the failing data page, whose respective threshold voltages are close to read threshold RV31 within a predefined range of the threshold voltages. The memory cells identified in WL(n) are more likely to read erroneously under cross-temperature conditions.

The memory controller programs to the high programming level (e.g., to L7) only memory cells in WL(n−1) that are adjacent to the identified memory cells in WL(n). The memory controller can apply such a selective programming method by masking out (i.e., disable from programming) memory cells that are likely to read correctly. By programming to L7 only selected memory cells in WL(n−1), the memory controller avoids undesirable degradation in other memory cells, e.g., due to over-programming.

In some cases, ECC decoding of the first WL in the memory block fails, in which case no previous WL is available to be evicted and programmed to a high programming level. In some embodiments, if ECC decoding of the LSB data page of WL(0) fails, the processor programs to a high programming level the closest word line to WL(0) whose LSB data page was decoded successfully, and evicted, and then the memory controller re-reads the LSB data page from WL(0). Note that typically a WL in which the LSB data page is decodable can be found in the vicinity of WL(0) because WLs having low indices are typically less vulnerable to cross-temperature conditions, as described above.

In some embodiments, ECC decoding of a LSB data page occurs after or during the programming of a word line WL(n) that has an erased neighbor word line, e.g., WL(n) or WL(n+1). Such a case occurs, for example, in programming an erased memory block. In such embodiments, the memory controller first programs the erased neighbor word line with user data, and re-reads the LSB data page of the failing word line WL(n). If decoding the ECC of the re-read LSB data page fails too, the memory controller programs the neighbor WL to a high programming level, e.g., after storing the data of this neighbor WL to another WL of the same memory block, or evicting this data to another memory block.

As noted above, programming the memory cells of a neighboring word line to L7, is a relatively time consuming programming operation. In some embodiments, the memory controller first programs data to the neighboring word line WL(n+1) or WL(n−1), as described above, in SLC mode, i.e., using only two programming levels, which is much faster than programming in MLC mode, and may be sufficient for recovering the LSB data page of WL(n). In an embodiment, if after programming the neighboring word line in SLC mode, the ECC decoding of the LSB data page re-read from WL(n) still fails, the memory controller may attempt programming data to the neighbor WL(n+1) or WL(n−1) using four or eight programming levels, or programming to L7, and then re-read the LSB data page from WL(n).

In some embodiments, the processor generally tracks faults occurring in accessing memory blocks, and upon detecting a fault event such as a Program Status Failure (PSF), Erasure Status Failure (ESF) OR Unrecoverable Error Correction Code (UECC) failure, the memory controller marks the failing memory block as an unusable block or as a "bad Block." In some embodiments, after recovering a memory block that failed due to a temperature difference between programming and reading, e.g., using the method of FIG. 4, the memory controller marks the failing memory block as an unusable block. In some embodiments, to prevent early failure of the whole memory system, the memory controller counts the number of UECC events occurring in the respective memory blocks, and marks as unusable only memory blocks in which the UECC count exceeds a predefined count limit.

The embodiments described above refer mainly to LSB data page read failure due to reading at a temperature much higher than the temperature at programming time. To compensate for this cross-temperature effect, the memory controller programs WLs neighbors to the failing WL to a high programming level such as L7.

A similar situation may occur in reading a USB data page at a temperature that is much lower than the temperature at programming time. In this case, the threshold voltage distributions are shifted to higher values, and the optimal read threshold RV37 between L6 and L7 may fall above the higher boundary of the voltage range supported for setting the read thresholds. As a result, the readout result corresponding to the USB data page may contain a large number of errors, even beyond the error correction capabilities of the underlying ECC used. In some embodiments, to recover a failing USB data page, the memory controller applies methods similar to those described above, in which the memory controller programs the neighbor WLs to a low programming level such as L0, instead of L7 used for recovering a failing LSB page.

Applying Dedicated Programming Schemes in Advance for Preventing Cross-Temperature Read Failures In the embodiments that were described above, the memory controller attempts to recover from cross-temperature read failures by programming one or more neighboring WLs to a high (or low) programming level.

In a different family of embodiments that will be described in detail below, the memory controller avoids cross-temperature read failures by applying, in advance, a dedicated programming scheme, when detecting an extreme temperature at programming time.

In the description that follows we refer mainly to preventing failures in reading LSB data pages in a TLC memory device. The disclosed techniques are similarly applicable, however, to reading USB data pages of the TLC device.

In the embodiments that will be described below the memory controller maps data bits to programming levels using the mapping of Table 1 above. Assuming random data (or pseudo random data), e.g., due to scrambling the data prior to programming, the stored data will be distributed uniformly (or close to uniformly) among the programming levels L0 . . . L7.

As a result, only about a quarter of the bits of the LSB data page will be encoded into bit-triple values in which the MSB and USB bits equal MSB=1 and USB=1, i.e., occupy programming levels L0 or L1. Therefore, only ¼ of the WL's memory cells, on average, are likely to read erroneously due to reading at a temperature much higher than the temperature at programming time.

In some embodiments, the ratio of memory cells programmed to L0 or L1 is larger than 1/4, in which case the ratio of memory cells programmed to some other pair of programming levels, e.g., L4 or L5 (USB=0, MSB=1) is less than 1/4. In such embodiments, the memory controller re-maps the data for storage to force the ratio of memory cells programmed to MSB=1 and USB=1 below 1/4, e.g., by inverting the USB page in the example above. The memory controller records the re-mapping event for recovering the unmapped data upon reading. By applying this method, it can be safely assumed for all disclosed methods (of the second family) that the number of cells in programming level L0 and L1 is below 1/4.

Figure 5:
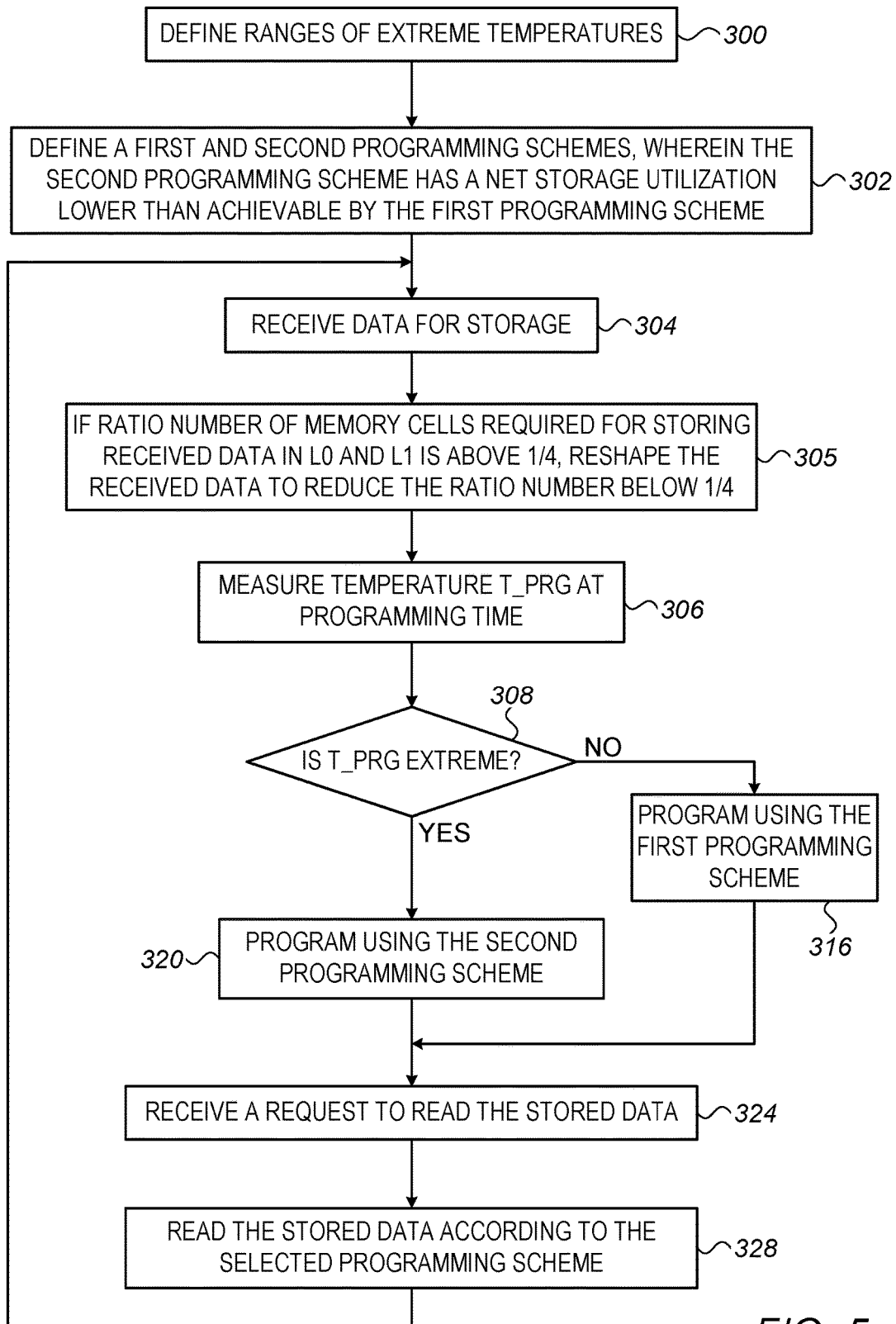
FIG. 5 is a flow chart that schematically illustrates a method for preventing cross-temperature read failures by applying a dedicated programming scheme in advance, in accordance with an embodiment that is described herein.

FIG. 5 is a flow chart that schematically illustrates a method for preventing cross-temperature read failures by applying a dedicated programming scheme in advance, in according with an embodiment that is described herein. The method can be executed by memory controller 40, R/W unit 36 or both. In the present example, we describe the method as being executed by the memory controller. For describing this method we further assume a TLC device.

At an initialization step 300, the memory controller defines ranges of extreme temperatures. A very high or a very low temperature at programming time indicates that an unrecoverable read failure (a UECC event) is likely to occur. In the present example, extreme temperatures for programming an LSB data page are predefined below a temperature denoted T_L, e.g., T_L=0° C. Similarly, extreme temperatures for programming a USB data page are predefined above a temperature denoted T_H, e.g., T_H=55° C. In some embodiments, the memory controller defines the ranges of extreme temperatures based, at least in part, on the expected range of temperatures over which the memory device is expected to operate. The range between T_L and T_H is considered a "normal" temperature range, i.e., a temperature range in which no special programming and reading schemes are required.

At a programming schemes definition step 302, the memory controller defines first and second programming schemes to be selected depending on the temperature at programming time. In some embodiments, the first programming scheme programs LSB, MSB and USB data pages conventionally, i.e., utilizing the full storage capacity of the memory cells. Such a conventional programming scheme supports programming 3N bits in a group of N memory cells of the WL.

The second programming scheme is designed to store the data pages with a lower net storage utilization than the first programming scheme. For example, in the second programming scheme the memory controller may store less than 3N bits in a group of N memory cells, or store in addition to user data redundant information to be used for recovering the read data upon failure.

By selectively applying the second programming scheme, the memory controller is able to recover the LSB (or USB) data page upon read failure under significant cross-temperature conditions. Several example embodiments that implement the second programming scheme are described in detail below.

At a reception step 304, the memory controller receives data for storage. For example, the data received may comprise one or more data pages destined for storage in a given WL. At a conditional inversion step 305, the memory controller checks whether the ratio of the memory cells to be programmed with the received data, and which belong to L0 or L1 is above 1/4, and if so, the memory controller manipulates the received data using linear inversion functions and/or other suitable functions so as to reduce the ratio number of the memory cells below 1/4. In an example embodiment, to reduce the ratio number below 1/4 the memory controller inverts the USB data page, as described above. At a temperature recording step 306, the memory controller measures the temperature T_PRG present at the time of programming the received data, for example, using a temperature sensor (not shown). At a temperature query step 308, the memory controller checks whether T_PRG falls within a range of extreme temperatures as defined at step 300.

When at step 308 the memory controller detects that T_PRG is not extreme, the memory controller programs the data received at step 304 to the memory device using the first programming scheme, at a first programming step 316. Otherwise, at step 308 T_PRG is found to be extreme, and the memory controller programs the data received using the second programming scheme, at a second programming step 320.

At a reading request step 324, which may be executed a long time after the programming operation of step 316 or 320, the memory controller receives a request to read the data that was stored at step 316 or 320. The temperature at reading time may be significantly different from the temperature T_PRG that was present when the data was programmed. At a reading step 328, the memory controller reads the requested data using a reading scheme that is compatible with the first or second programming scheme applied at step 316 or 320.

Note that in the method of FIG. 5, the memory controller is typically unaware of the temperature at reading time. Therefore, the reading scheme used by the memory controller does not depend on the temperature difference between reading and programming times, but on the programming scheme used in storing the data. Following step 328 the memory controller loops back to step 304 to receive subsequent data for storage.

In a variant embodiment, the memory controller programs data using the second programming scheme, independently of the temperature. In such embodiment, the memory system has sufficient storage space for storing the user data plus the additional space required by the second programming scheme (also referred to as "over provisioning"). In this variant embodiment, the overall storage space available for user data is reduced compared to the embodiments that use the second programming scheme selectively.

In some embodiments, the memory controller cyclically (e.g., periodically) tracks temperature changes during its lifetime, and programs data using the first or second programming scheme based on the measured temperature as described above. In such embodiments, the memory controller can read reliably data that was programmed at a normal temperature (using the first programming scheme) over the entire range of operative temperatures (even if reading occurs at an extreme temperature).

Now we describe in detail several embodiments that implement the second programming scheme and can be used, for example, at step 320 of FIG. 5.

METHOD_1—In this embodiment, when programming data to a given WL, the memory controller programs user data to the MSB and USB data pages, and programs dummy bits to the LSB data page. In the present embodiment, to avoid cross-temperature failure in reading LSB data, no user data is stored in LSB data pages, meaning that only 2/3 of the available storage capacity is utilized.

METHOD_2—In this embodiment, when storing data to a LSB data page of some WL, the memory controller additionally stores one or more instances of this data in a LSB data page of the originally destined WL and in one or more other WLs. In the context of the present disclosure and in the claims the term "instance" refers to identical copies of the data, as well as to different versions of the data, e.g., generated by different respective ECC encoding schemes. For example, in one embodiment, each instance comprises a duplicate of the same data, and the memory controller stores the data encoded using a suitable ECC to a LSB data page in word lines WL(n) and WL(n+1). In METHOD_2 the storage utilization depends on the number of replicas stored. For example, if a LSB data page is stored in two WLs, the resulting utilization (with regard to LSB data) is 1/2.

To recover the LSB data page upon reading failure, the memory controller reads and decodes the ECC of the LSB data page from WL(n) and from WL(n+1) to produce respective first and second readouts. The memory controller additionally reads and decodes the ECC of the MSB and USB data pages from WL(n) and WL(n+1). If decoding the ECC fails in both the first and second readouts, the memory controller selects each LSB bit from the first or second readout for which the (MSB, USB) combination read from the respective WL is different from (1,1). In bit locations at which MSB=1 and USB=1 in both the first and second readouts, the memory controller selects the LSB bit from one of the readouts using any suitable method, e.g., randomly.

Note that although about 1/4 of the memory cells in each WL are programed with MSB=1 and USB=1 (and are therefore likely to read LSB data erroneously due to cross-temperature), the number of such memory cells common to both WLs is only about 1/4*1/4. Therefore, the LSB data page recovered based on both WL(n) and WL(n+1) will typically contain a smaller number of errors (e.g., bit-flips) compared to recovering the LSB data page from a single WL. As a result, for an ECC that can correct up to a given number of errors, using METHOD_2 increases the probability of successful ECC decoding of the LSB data page.

In some embodiments, the memory controller decodes the ECC of the read LSB data page using soft decoding techniques, e.g., by assigning to the readout bits respective reliability metrics such as Log Likelihood Ratio (LLR) metrics. In such embodiments, when reading the same LSB bit value from both WL(n) and WL(n+1), the memory controller assigns to this bit a high reliability score. When reading from the two WLs different bit values, the memory controller assigns to the selected bit a low reliability score.

In some embodiments, the memory controller applies METHOD_2 by duplicating data encoded using a suitable ECC to be stored in a LSB data page, over three or more WLs, which further increases the probability of successful ECC decoding, compared to the two WLs case described above. In an embodiment, when at programming time the memory controller duplicates the LSB data page over an odd number of WLs, the memory controller selects, at reading time, an LSB bit at each bit location using a majority vote selection.

In some embodiments, in addition to selecting the correct LSB bits using RV31 from each instance (WL) as described above, the memory controller examines the bits corresponding to the read threshold RV35 (about half of the bits relate to RV31 and half to RV35) and assigns a relevant LLR according to a majority vote or using any other suitable method to decide whether a certain bit is more reliable (for example, if a given bit has the same value in both instances, the respective LLR score would be higher than in case these bit values differ).

METHOD_3—Let D denote bits to be stored as a LSB data page in WL(n). Similarly to METHOD_2, the memory controller stores D in multiple WLs, e.g., WL(n) and WL(n+1). Unlike METHOD_2, however, in METHOD_3 the memory controller calculates the ECC over subsets of D, denoted D1 and D2, each comprising half of the bits in D. Let P1 and P2 denote the parity bits resulting by ECC encoding D1 and D2, respectively. The memory controller programs DE1=[D, P1] in WL(n), and DE2=[D, P2] in WL(n+1). Note that in METHOD_3, DE1 and DE2 are two different instances of D to be stored. The storage utilization of METHOD_3 is similar to that of METHOD_2, i.e., the storage utilization for storing LSB data is ½ when storing the encoded LSB data page in two different WLs.

To recover the LSB data page, the memory controller reads DE1 and DE2, and decodes the read DE1 and DE2 to recover D1 and D2, respectively. Since the ECC is calculated only over half of the bits of D, the probability of successful ECC decoding of DE1 and DE2 is much higher compared to ECC encoding and decoding the entire D using the same ECC (as in METHOD_2).

Moreover, since D was fully programmed in each of WL(n) and WL(n+1), when the ECC decoding of DE1 and/or DE2 fails, the memory controller selects the LSB bit for which the combination (MSB, USB) is different from (1, 1), in an embodiment, as described above.

In a variant embodiment of METHOD_3, the memory controller encodes the entire D to produce parity bits PD and additionally encodes a subset of D denoted DH (e.g., comprising half, or some other portion, of the bits in D) to produce parity bits PDH. The memory controller stores D_Full=[D, PD] as a LSB data page of one WL, e.g., WL(n) and stores D_Half=[D, PDH] as a LSB data page of another WL, e.g., WL(n+1).

In the variant embodiment of METHOD_3, to recover D, the memory controller first reads D_Full from WL(n) and decodes the ECC to recover D. If the decoding of the read D_Full fails, the memory controller reads D_Half from WL(n+1), and decodes the ECC to recover the DH part of D. In an embodiment, if DH was recovered successfully, the memory controller replaces the relevant bits in the D read from WL(n) with respective (non-erroneous) bits of the recovered DH to produce an outcome denoted DC. The memory controller then re-attempts to recover D by decoding the ECC of [DC, PD].

In some embodiments, when the decoding of D_Half as read from WL(n+1) fails, the memory controller, attempts recovering the DH part of D in the respective locations in which MSB=1 and USB=1, as described above. This approach can be used similarly in decoding [DC, PD] because D is also stored in WL(n+1). Therefore this approach to reduce the number of errors in D_Full can be applied before and/or after decoding D_Half.

METHOD_4—In the embodiment of METHOD_4, the memory controller receives data to be programmed in LSB, MSB and USB data pages of some WL. The memory controller identifies in the data pages to be programmed bit locations in which the MSB data page and the USB data page will be programmed to MSB=1 and USB=1. The memory controller then sets dummy bits (e.g., bit value '0') in the identified bit locations of the LSB data page to be programmed. The net storage utilization, for LSB data, resulting by using this programming scheme is ¾ (i.e., by using this method about 25% of the LSB data storage space is lost).

In an embodiment, the memory controller sequentially scans the bits to be programmed in the LSB data page. When encountering a (MSB=1,USB=1) combination, the memory controller sets the corresponding bit in the LSB data page to a dummy value. The memory controller sets the next data bit in a subsequent bit location in which the (MSB, USB) combination is different from (1, 1). The memory controller applies ECC encoding to each of the USB and MSB data pages, as well as to the punctured LSB data, and programs the encoded data pages to the memory cells of the WL. Table 6 depicts programming (1,1,0) bits to the LSB data page using METHOD_4.

TABLE 6

Programming LSB data using METHOD_4

| Data page/Bit index | Bit0 | Bit1 | Bit2 | Bit3 |
| --- | --- | --- | --- | --- |
| USB | 1 | 1 | 0 | 0 |
| MSB | 0 | 1 | 0 | 0 |
| LSB (conventionally) | 1 | 1 | 0 | 0 or 1 |
| LSB (METHOD_4) | 1 | 0 (Dummy) | 1 | 0 |

To recover data that was programmed using METHOD_4, the memory controller reads and decodes the ECC of the USB, MSB and LSB data pages. The memory controller then extracts the user data from the decoded LSB data page only from bit locations in which the (MSB, USB) combination is different from (1, 1).

METHOD_5—In this embodiment, the memory controller stores data D in an LSB data page in one word line, e.g., WL(n), derives auxiliary bits from D, and stores the auxiliary bits in WL(n+1). In some embodiments, the memory controller derives the auxiliary bits by identifying bit locations in D corresponding to bit locations in the higher significant pages in which MSB=1 and USB=1. The bits at the identified locations are vulnerable to cross-temperature effects, as explained above. In the description that follows the identified bits are denoted 'B.' and the auxiliary bits are derived from B. The storage utilization in METHOD_5 depends on the number of auxiliary bits. Let LD denote the length of a LSB data page and LA the number of the auxiliary bits. The storage utilization is given by LD/(LA+

LD). For example, when the auxiliary bits correspond to locations in which MSB=1 and USB=1, as described above, the storage utilization for the LSB data is about 4/5 (because the number of auxiliary bits in this case is about 1/4 of the LSB data page length).

In some embodiments, the memory controller sets the auxiliary bits to B, and stores these bits in accordance with the order of their respective bit locations in D, so that the memory controller can place the auxiliary bits back correctly at reading, as will be described below. The memory controller stores the auxiliary bits in WL(n+1) in a data page (e.g., in a MSB data page) that is more reliable than storing in a LSB data page.

Consider an example in which the memory controller is required to store data in WL(n) as depicted in Table 7. The example refers to the first ten memory cells in WL(n).

TABLE 7

Example data for storage

| Page/Cell | 0 | 1 | 2 | 3 | 4 | 5 | 6 | 7 | 8 | 9 |
|---|---|---|---|---|---|---|---|---|---|---|
| LSB | 1 | 0 | 0 | 1 | 1 | 0 | 0 | 0 | 1 | 0 |
| MSB | 1 | 1 | 0 | 1 | 1 | 0 | 1 | 0 | 1 | 1 |
| USB | 1 | 0 | 0 | 1 | 1 | 1 | 1 | 0 | 0 | 1 |

In seen in Table 7, the bit locations (or cell index) corresponding to MSB=1 and USB=1 are {0, 3, 4, 6, 9}. The respective LSB bits in these locations are {1, 1, 1, 0, 0}. Therefore, the memory controller stores in WL(n+1) auxiliary bits given by B=11100.

To recover the LSB data page of WL(n), the memory controller first reads the LSB data page from WL(n) and decodes the ECC of the read LSB data page. If decoding the ECC fails, the memory controller recovers the auxiliary bits B from WL(n+1). By reading and decoding the MSB and USB data pages of WL(n), the memory controller identifies the bit locations in the failing LSB data page from which the auxiliary bits B were extracted. The memory controller then replaces bits of the read LSB data page that has failed, with the respective bits of B, at the respective bit locations.

As noted above, the number of bits in B is 1/4, on average, of the LSB data page size. Therefore, METHOD_5 requires for the LSB data page a storage space that is 5/4 times larger than the data page size.

Note that typically not all of the identified bits at the MSB=1 and LSB=1 locations of the failing LSB data page read erroneously. In one variant embodiment of METHOD_5, the memory controller stores in WL(n+1) only a subset of the auxiliary bits B. For example, the memory controller stores a punctured version B' of B, e.g., only one bit every two or three bits of B. Upon reading, the memory controller uses the same puncturing scheme for placing the recovered bits B' in their respective locations in the failing LSB data page.

In another variant embodiment of METHOD_5, the memory controller derives the auxiliary bits by encoding B using a suitable ECC to produce parity bits denoted BP. The number of bits in BP is typically much smaller than in B. In this variant embodiment, the memory controller stores in WL(n+1) the redundancy bits BP as the auxiliary bits, which is more efficient than storing B. Upon reading, when decoding the read LSB data page fails, the memory controller extracts the bits at the MSB=1 and USB=1 locations, decodes the extracted bits using the parity bits BP recovered from WL(n+1), and replaces the bits of the failing LSB data at the locations with the decoded bits.

METHOD_6—In this embodiment, the memory controller splits the bits (D) to be programmed in a LSB data page to into first and second halves, denoted D_H1 and D_H2, respectively. The memory controller can split D using any suitable splitting scheme. For example, D=[D_H1,D_H2], i.e., the memory controller splits the bits of D sequentially into first and second halves. As another example, the memory controller takes for D_H1 and D_H2 the bits of D having even and odd indices, respectively. The memory controller concatenates each DH1 and DH2 with '1' bits to complete to the size of the data page, and programs the extended halves of D in neighboring word lines, as depicted in Table 8.

TABLE 8

A scheme for programming LSB data

| Word line/LSB data | First half | Second half |
|---|---|---|
| WL (n) | D1_H1 | 1 . . . 1 |
| WL (n + 1) | 1 . . . 1 | D1_H2 |
| WL (n + 2) | D2_H1 | 1 . . . 1 |
| WL (n + 3) | 1 . . . 1 | D2_H2 |

In the example of Table 8, the memory controller stores the halves of D1 in word lines WL(n) and WL(n+1), and the halves of D2 in word lines WL(n+2) and WL(n+3). Since each LSB data page is stored in two WLs, the resulting storage utilization for LSB data is 1/2.

Using the programming scheme as depicted in Table 8 causes shifting the programming levels occupied by the LSB data page halves. Note that by using the mapping scheme of Table 1, the 1 . . . 1 bits are mapped to one of the programming levels L0, L5, L6 and L7 (L0 is the erasure level). For example, about 3/4 of the 1 . . . 1 bits in the first half of WL(n+1) will be programmed to L5, L6 or L7, and will cause the corresponding threshold-voltage distributions in WL(n) to shift to higher voltage values due to WL-to-WL coupling.

METHOD_7—In the embodiments described above, all eight programming levels L0 . . . L7 are used, e.g., by encoding bits to programming levels using the mapping of Table 1. As noted above, the cross-temperature reading error occurs in using RV31 for distinguishing between the threshold voltage distributions PV3E and PV31 corresponding to L0 and L1, respectively. In some embodiments, the memory controller maps bits to programming levels in a manner that no bits are mapped to programming level L1. In such embodiments, the memory controller can set RV31 at a midpoint between PV3E and PV32 that is within the supported range of read thresholds. Note that in such a mapping only seven programming levels out of the available eight programming levels are actually utilized.

When using the full eight programming levels, a group of N memory cells supports $8^N=2^{3N}$ combinations of the eight programming levels. Let Nb denote the number of bits that can be stored in the N memory cells. In using eight programming levels, Nb is given by $Nb=N \cdot Log_2(8)=3N$ bits.

Consider programming the N memory cells using only seven programming levels. In this case, the number of combinations is given by $7^N$. Nb should now satisfy $Nb=floor[N \cdot Log_2(7)] \approx Floor(2.807 \cdot N)$. For example, for a group of N=5 memory cells, a number of Nb=14 can be stored.

TABLE 9

Comparing Nb for 8 and 7 programming levels

| Number of memory cells N | For 8 programming levels: Nb = 3N | For 7 programming levels: Nb = floor [N·Log$_2$(7)] |
|---|---|---|
| 1 | 3 | 2 |
| 2 | 6 | 5 |
| 3 | 9 | 8 |
| 4 | 12 | 11 |
| 5 | 15 | 14 |
| 6 | 18 | 16 |

The storage utilization in METHOD_7 when using groups of N memory cells and seven out of the available eight programming levels is given by floor[N·Log$_2$(7)]/(3N).

The embodiments described above are given by way of example, and other suitable embodiments can also be used. For example, in some of the disclosed embodiments, programming one WL causes change to the storage values of memory cells in another WL due to coupling among WLs. Alternatively or additionally, other phenomena such as program disturb and back-pattern can also be used to achieve a similar effect.

Although the embodiments described above refer mainly to a TLC device, the disclosed techniques are also applicable mutatis mutandis to MLC devices other than TLC, e.g., to Quad-Level Cell (QLC) devices.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A memory system, comprising:
an interface, configured to communicate with a plurality of memory cells that store data by setting the memory cells to analog voltages representative of respective storage values; and
storage circuitry configured to:
program a data unit to a first group of the memory cells;
read the data unit from the first group using at least a read threshold to produce a first readout;
in response to detecting that reading the data unit has failed because at the time of reading the first group, the read threshold has fallen outside a range of read thresholds supported by the memory cells, due to a temperature difference between a time of programming the first group and a time of reading the first group, program a second different group of the memory cells;
after programming the second group, re-read the data unit from the first group using the at least read threshold to produce a second readout; and
recover the data unit from the second readout.

2. The memory system according to claim 1, wherein the storage values correspond to respective predefined programming levels, and wherein the storage circuitry is configured to program at least some of the memory cells in the second group to a highest or to a lowest programming level among the predefined programming levels.

3. The memory system according to claim 2, wherein the storage circuitry is configured to identify, in the first group, one or more memory cells that are estimated to have been read incorrectly, and to program only memory cells in the second group having same respective indices as the identified memory cells of the first group, to the highest or to the lowest programming level.

4. The memory system according to claim 2, wherein the storage circuitry is configured to predefine an intermediate programming level between the highest and the lowest programming levels, and to program to the highest programming level only the memory cells in the second group that belong to programming levels above the intermediate programming level.

5. The memory system according to claim 1, wherein the storage circuitry is configured to evict all data stored in the second group to another group of memory cells, to erase the memory cells in the second group, and then to program the second group.

6. The memory system according to claim 1, wherein the memory cells are arranged in multiple memory blocks that comprise multiple word lines, and wherein the first group and the second group belong to respective first and second non-adjacent word lines in a common memory block.

7. The memory system according to claim 1, wherein the storage circuitry is configured to program the second group without first erasing the memory cells in the second group.

8. The memory system according to claim 1, wherein the first group comprises a Word Line (WL) in a memory block, and wherein, in response to detecting that reading the data unit from the first group has failed, the storage circuitry is configured to evict to another memory block all WLs in the memory block that read correctly, to scan the remaining WLs that failed, and to recover data read from each of the remaining WLs by programming one or more of the WLs that were evicted.

9. The memory system according to claim 1, wherein the storage circuitry is configured to program the second group using a programming scheme that comprises less than a number of programming levels used in programming the first group.

10. A method for data storage, comprising:
in a memory system comprising a plurality of memory cells that store data by setting the memory cells to analog voltages representative of respective storage values,
programming a data unit to a first group of the memory cells;
reading the data unit from the first group using at least a read threshold to produce a first readout;
in response to detecting that reading the data unit has failed because, at the time of reading the first group, the read threshold has fallen outside a range of read thresholds supported by the memory cells, due to a temperature difference between a time of programming the first group and a time of reading the first group, programming a second different group of the memory cells;
after programming the second group, re-reading the data unit from the first group using the at least read threshold to produce a second readout; and
recovering the data unit from the second readout.

11. The method according to claim 10, wherein the storage values correspond to respective predefined programming levels, and wherein programming the second group comprises programming at least some of the memory cells in the second group to a highest or to a lowest programming level among the predefined programming levels.

12. The method according to claim 11, and comprising identifying, in the first group, one or more memory cells that are estimated to have been read incorrectly, wherein programming the second group comprises programming only memory cells in the second group having same respective indices as the identified memory cells of the first group, to the highest or to the lowest programming level.

13. The method according to claim 11, and comprising predefining an intermediate programming level between the highest and the lowest programming levels, wherein programming the second group comprises programming to the highest programming level only the memory cells in the second group that belong to programming levels above the intermediate programming level.

14. The method according to claim 10, wherein programming the second group comprises evicting all data stored in the second group to another group of memory cells, erasing the memory cells in the second group, and then programming the second group.

15. The method according to claim 10, wherein the memory cells are arranged in multiple memory blocks that comprise multiple word lines, and wherein the first group and the second group belong to respective first and second non-adjacent word lines in a common memory block.

16. The method according to claim 10, wherein the programming the second group comprises programming the second group without first erasing the memory cells in the second group.

17. The method according to claim 10, wherein the first group comprises a Word Line (WL) in a memory block, and comprising, in response to detecting that reading the data unit from the first group has failed, evicting to another memory block all WLs in the memory block that read correctly, scanning the remaining WLs that failed, and recovering data read from each of the remaining WLs by programming one or more of the WLs that were evicted.

18. The method according to claim 10, wherein programming the second group comprises programming the second group using a programming scheme that comprises less than a number of programming levels used in programming the first group.

\* \* \* \* \*